United States Patent
Sanzo et al.

(10) Patent No.: US 6,924,633 B2
(45) Date of Patent: Aug. 2, 2005

(54) PULSE WIDTH MODULATION CONTROLLER WITH DOUBLE PULSE IMMUNITY

(75) Inventors: Christopher J. Sanzo, Providence, RI (US); Tetsuo Tateishi, Warwick, RI (US)

(73) Assignee: Texas Instruments Incorporated, Dallas, TX (US)

( * ) Notice: Subject to any disclaimer, the term of this patent is extended or adjusted under 35 U.S.C. 154(b) by 11 days.

(21) Appl. No.: 10/741,683

(22) Filed: Dec. 19, 2003

(65) Prior Publication Data

US 2005/0134244 A1   Jun. 23, 2005

(51) Int. Cl.[7] .............................................. G05F 1/44

(52) U.S. Cl. ................................................. 323/283

(58) Field of Search .................... 323/283, 284, 323/285

(56) References Cited

U.S. PATENT DOCUMENTS 5,610,503 A * 3/1997 Fogg et al. .................. 323/283

OTHER PUBLICATIONS

USC Electrical Engineering; "Motor Controller"; Project #9; University of South Carolina 2003; pp. 1-4.

Unitrode Corporation; "Application Note U-150; Applying the UCC3570 Voltage-Mode PWM Controller to Both Off-Line and DC/DC Converter Designs", by Robert A Mammano, Vice President, Advanced Technology; Copyright 1999, Texas Instruments Incorporated.

Unitrode Products from Texas Instruments; "Micropower Voltage Mode PWM"; Mar. 1999—Revised Mar. 2003.

Integrated,Circuits Unitrode; "Switched Mode Controller for DC Motor Drive"; Sep. 1996; pp. 1-6.

"739 MOT Introduction to Motors and Motor Control Theory"; 2003 Microchip Technology Incorporated; pp. 1-101.

* cited by examiner

*Primary Examiner*—Shawn Riley
(74) *Attorney, Agent, or Firm*—W. Daniel Swayze, Jr.; W. James Brady; Frederick J. Telecky, Jr.

(57) ABSTRACT

A pulse width modulation (PWM) controller includes a shutter circuit interposed between a PWM modulator and a driver circuit. The shutter circuit receives a raw PWM output signal from the PWM modulator and processes the raw PWM signal to eliminate double pulsing that may be present on the raw PWM signal. Bypass logic responsive to a switch or software controlled enable input is provided to permit the shutter circuit to be included in the PWM controller or alternatively, to be bypassed.

9 Claims, 3 Drawing Sheets

PULSE WIDTH MODULATION CONTROLLER WITH DOUBLE PULSE IMMUNITY

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates to a pulse width modulator that provides double pulse immunity in a high speed pulse width modulation (PWM) controller.

Pulse width modulators are often employed in motor and power controllers. Techniques for the generation of a pulse with modulated signal are well known in which a digital signal is employed to power a device or drive a motor and the duty cycle of the digital signal is varied to determine the power delivered to the load. In such a system an analog waveform is converted into a pulse width modulated signal. If the analog waveform is a generally symmetric triangular waveform, a comparator is typically used to produce both transitions of the pulse width modulated digital signal, i.e. when the portion of the analog waveform having a positive slope crosses a reference voltage, the PWM output signal transitions from a first logic state to a second logic state and when a portion of the analog waveform having a negative slope crosses the reference voltage, the PWM output signal transitions from the second logic state to the first logic state.

In a known PWM power controller a sawtooth generator is employed to provide a sawtooth waveform that is used as the analog input waveform to the comparator. The sawtooth waveform is a periodic waveform which may have a first portion in the form of a generally sloped ramp and a second portion with a rapid transitional edge. A comparator is typically employed to generate a transition in the PWM output signal from a first state to a second state when the sloped ramp crosses a reference voltage. The rapidly transitioning edge of the sawtooth typically corresponds to an edge of a clock pulse and the corresponding clock pulse edge is typically employed to generate the transition of the PWM output signal from the second state to the first state.

It is sometimes desirable to utilize a high speed comparator within the PWM controller to assure that fast rise and fall times are maintained. In a PWM controller employing an unlatched comparator, the output pulse is a function of the comparator decision. Consequently, if there is noise on the analog input signal to the comparator or on the reference input to the comparator, the comparator output may pulse on and off in response to the noise. Such undesirable pulsing can introduce an undesirable error component into the PWM output signal in the form of repeated pulses. This is known in the art as "double pulsing" in the circumstance in which a noise component introduces one or more extraneous pulses to the PWM output. In the case in which a generally symmetric triangular waveform is used as the analog input signal, noise could potentially produces double pulsing of the PWM signal at locations corresponding to reference voltage crossings by either the positive or negative going ramps of the analog input waveform.

A typical prior art PWM controller is depicted in FIG. 1. Referring to FIG. 1, a comparator 2 receives as inputs a periodic analog waveform 4 and a reference voltage 6. The comparator 2 generates a PWM output signal 8 in which the duty cycle of the signal varies with the reference voltage. The PWM output signal 8 is coupled to a driver 10 which produces a driver output signal 12. The driver output signal 12 is coupled to an output circuit 14 that provides proper biasing of the switching transistor when necessary and that includes a smooting LC filter as known in the art. The output circuit is coupled to the load 18 via the output signal 16. The PWM controller depicted in FIG. 1 is susceptible to double pulsing at the output 8 of the comparator 2 in the event of noise on the analog waveform 8 or the reference input 6.

It would therefore be desirable to have a comparator based PWM controller that can employ a high speed comparator so as to achieve fast rise and fall times while achieving double pulse immunity.

BRIEF SUMMARY OF THE INVENTION

In accordance with the present invention, a pulse width modulation controller having a shutter circuit is disclosed. The disclosed PWM controller includes a comparator that generates a raw PWM signal from either an analog input waveform having periodic and generally symmetric positively and negatively sloped ramp portions or alternatively a periodic sawtooth waveform having a ramped edge and a rapidly transitioning edge. The raw PWM signal is coupled to the input of the shutter circuit and the shutter circuit produces a PWM output signal. The shutter circuit eliminates double pulsing that may be present on the raw PWM signal.

The shutter circuit employs a first latch that is used to arm the second latch. More specifically, in response to the detection of a threshold crossing in a first direction by the comparator, the first latch is set. The second latch is set concurrently with the first latch and once the first latch is set, the second latch is armed to reset upon the detection of a threshold crossing in a second direction by the comparator, wherein the second direction is opposite to the first direction. The first latch is reset periodically by a high speed one-shot at a point in time when the voltage of the periodic analog input signal to the comparator is not near the reference voltage. The output of the second latch corresponds to the output of the shutter circuit. In the foregoing manner the shutter circuit prevents double pulsing at the shutter circuit output.

The PWM output is coupled to a driver that drives a switching transistor. The output of the switching transistor is coupled to a load through an output circuit. The output of the output circuit is also fed back to a reference amplifier which is used to establish the reference voltage for the comparator.

The presently disclosed shutter circuit may be enabled or disabled under software control. When the shutter circuit is enabled, it functions to limit double pulsing as described above. When the shutter circuit is disabled, the shutter circuit is bypassed and the raw PWM signal from the comparator corresponds to the PWM output signal from the shutter circuit.

Other features, aspects and advantages of the presently disclosed pulse width modulation circuit having double pulse immunity will be apparent to those of ordinary skill in the art.

BRIEF DESCRIPTION OF THE SEVERAL VIEWS OF THE DRAWINGS

The invention will be more fully understood by reference to the Detailed Description of the Invention in conjunction with the Drawing of which.

DETAILED DESCRIPTION OF THE INVENTION

Figure 1:
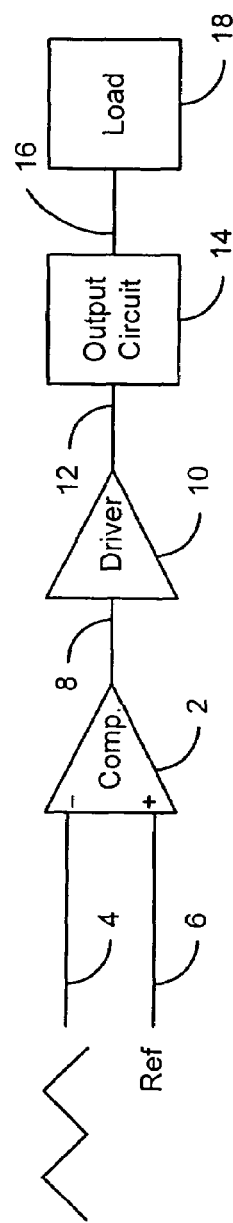
FIG. 1 is a block diagram depicting a conventional prior art PWM controller.
Figure 2:
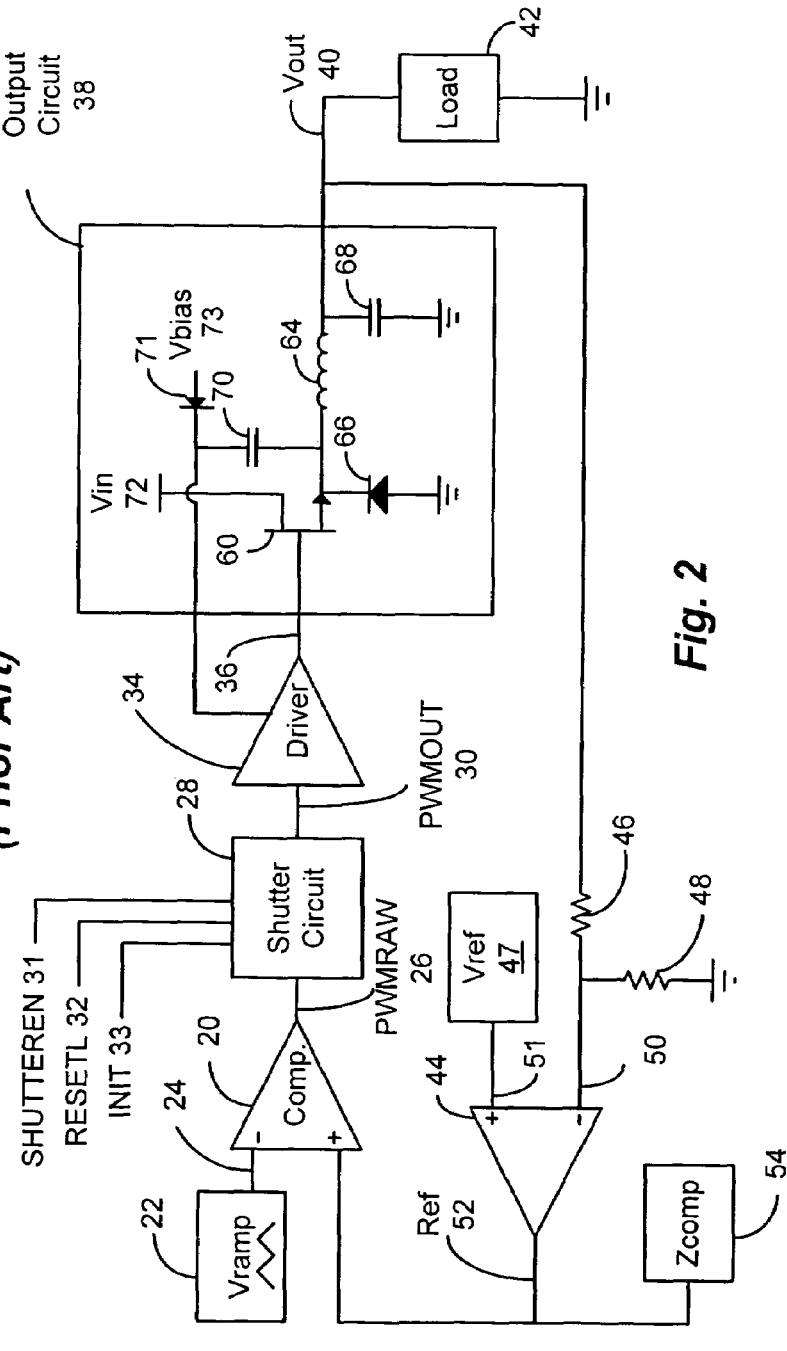
FIG. 2 is a block diagram depicting a DC-DC power controller in accordance with the present invention and including a shutter circuit interposed operative to eliminate double pulsing.
Figure 3:
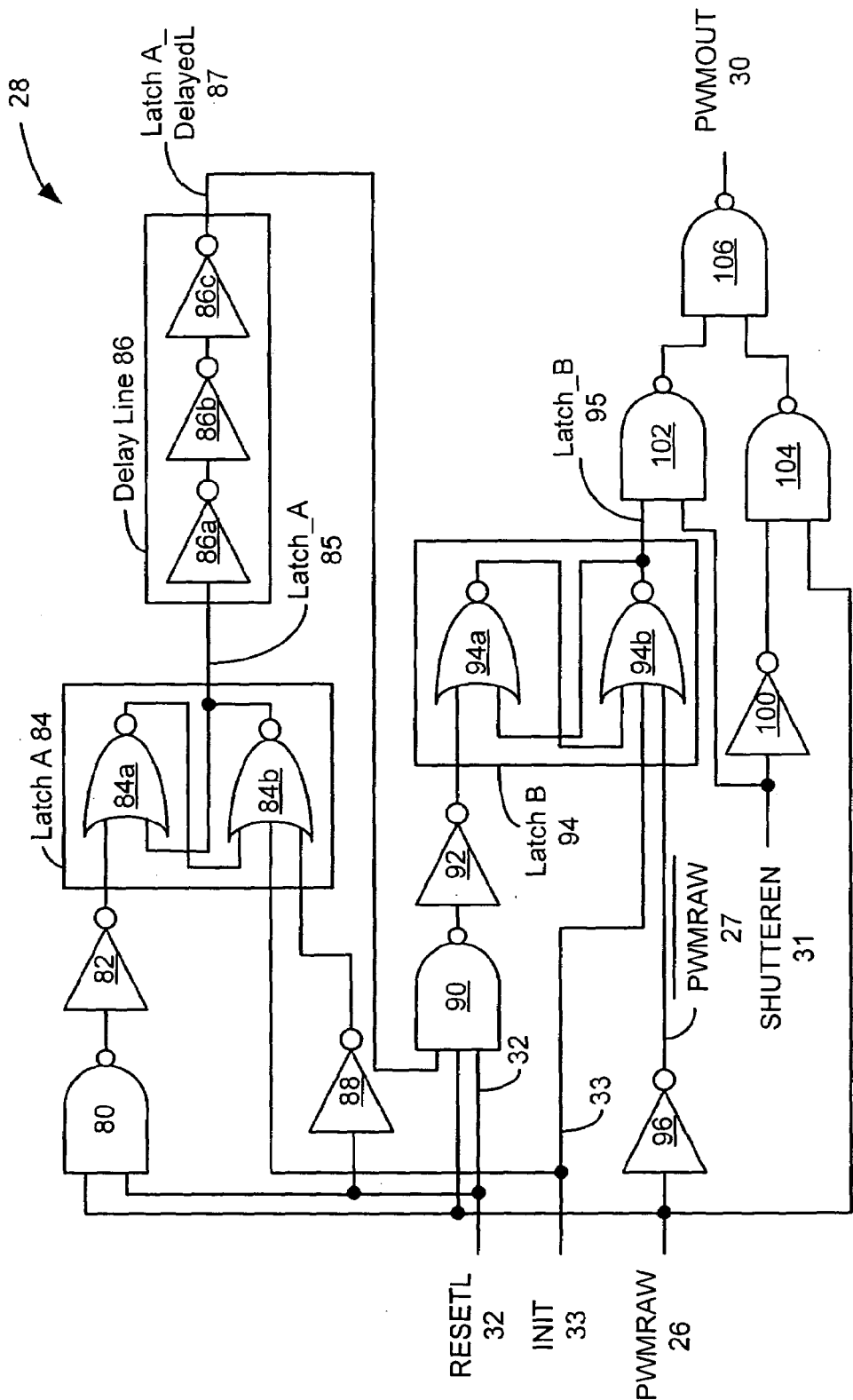
FIG. 3 is a schematic diagram of an illustrative embodiment of the shutter circuit of FIG. 2.
Figure 4:
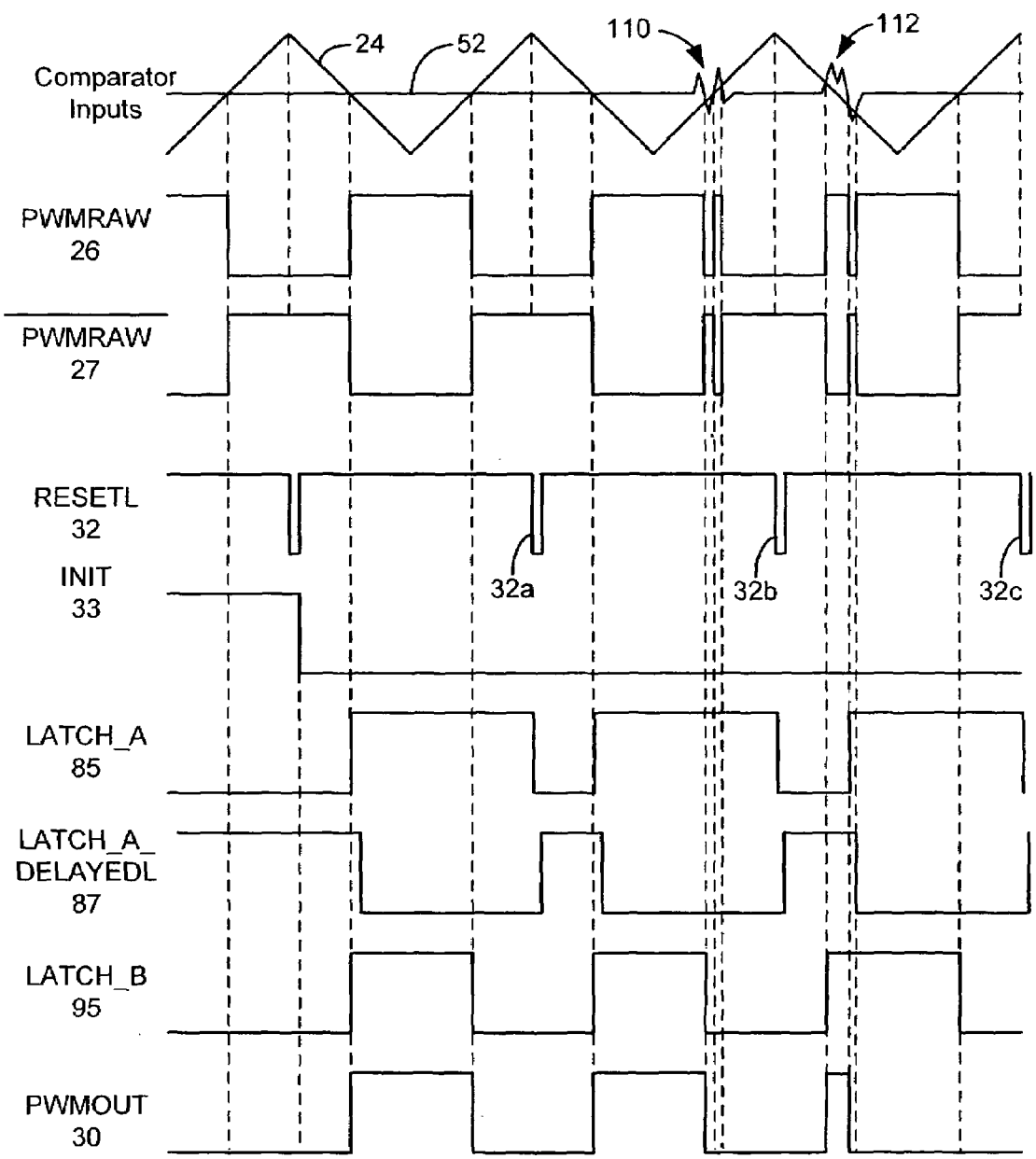
FIG. 4 is a timing diagram depicting exemplary timing within the shutter circuit of FIG. 3.

In accordance with the present invention, a pulse width modulation controller having a shutter circuit is disclosed. Referring to FIGS. 2–4 the disclosed PWM controller includes a comparator 20 that generates a raw PWM signal PWMRAW 26 from a waveform generator 22 that generates either an analog input waveform having periodic positively and negatively sloped ramped portions or alternatively, a periodic sawtooth waveform having a ramped edge and a rapidly transitioning edge. The raw PWM signal PWMRAW 26 is coupled to the input of a shutter circuit 28 and the shutter circuit 28 produces a PWM output signal PWMOUT 30 that eliminates instances of double pulsing that are present on the PWMRAW signal 26. As used herein, the term double pulsing is used generally to describe undesired repeating pulsing of the shutter circuit output whether such pulsing involves two or more pulses within a specified periodic interval.

The comparator 20 receives as inputs a periodic waveform 24 from the waveform generator 22. Typically, the waveform generator 22 is clocked by an input clock (not shown) and produces either a generally symmetric triangular waveform having generally equal but opposite slopes or a periodic sawtooth waveform have a first sloped portion and a second rapidly transitioning portion. The comparator 20 produces a pulse width modulated signal, PWMRAW 26, that is coupled to the input of a shutter circuit 28. The shutter circuit 28 also receives as inputs an INIT signal 33 that is employed to initialize the state of the shutter circuit 28 and a RESETL signal 32 that serves as a periodic reset signal employed during the operation of the shutter circuit as subsequently discussed. The waveform generator ramp 22 and the RESETL signal 32 may produce output signals that are derived from a common clock signal (not shown). The shutter circuit 28 also receives as an input a SHUTTEREN signal 31 that serves to enable or disable the shutter circuit 28. When the SHUTTEREN signal 31 in the illustrated embodiment is active or enabled (high), the shutter circuit is operative to couple an output signal to the driver 34 that is devoid of double pulsing. When the SHUTTEREN signal 31 is inactive (low), the PWMRAW signal 26 is gated through to the input of the driver 34 as the PWMOUT signal 30. Thus, when the shutter circuit 30 is disabled, any double pulsing present on the raw PWM output is present on the shutter circuit 28 output PWMOUT 30. The operation of the shutter circuit 28 is discussed below in greater detail in connection with FIGS. 3 and 4.

The PWMOUT signal 30 from the shutter circuit 28 is coupled to the input of the driver 34. The driver output signal 36 is coupled to the input of an output circuit 38. The output circuit 38 is a switchmode power delivery circuit commonly known as a step-down or "buck" converter that converts a high voltage to a low voltage using at least one switching device such as a switching transistor 60 and a smoothing circuit consisting of a series inductor 64 and a capacitor 68.

More specifically, the driver 34 output signal 36 is coupled to the switching transistor 60 which may comprise an N-Channel MOSFET, a P-Channel MOSFET, a bipolar transistor, a switch (relay) or any other suitable switching device. The drain of the N-Channel MOSFET in the illustrated embodiment is coupled to a supply rail Vin 72 and the source of the MOSFET is coupled to ground through a clamp diode 66. The driver 34 receives a bias voltage supplied by Vbias 73 through a blocking diode 71 that forms a charge pump in conjunction with capacitor 70. A voltage of approximately Vbias is maintained across the capacitor 70. As the switching device 60 switches on and off the junction of the capacitor 70 and the blocking diode 71 switches between approximately Vin and (Vbias+Vin) to assure that the supply rail to the driver 34 is at a voltage sufficient to assure proper biasing of the switching transistor 60, which is depicted as an N-Channel MOSFET. The charge pump is not required in the circumstance in which a P-Channel MOSFET or a switch (relay) is used as the switching device 60. Additionally it should be recognized that for other types of switching devices, the charge pump may not be needed to assure proper biasing of the switching device 60.

A series LC filter is formed by inductor 64 and capacitor 68. The capacitor is connected between the inductor 64 and ground. The junction of the inductor 64 and the capacitor 68 is an output signal Vout 40 that corresponds to the output of the output circuit 38. The series LC circuit operates as a smoothing circuit to smooth the output signal Vout 40. The output signal Vout 40 is coupled to a load 42, such as electronic circuitry or a motor to be powered.

The Vout signal 40 is also coupled to an error amplifier 44 through a resistive voltage divider formed by series resistors 46 and 48. The junction 50 of the resistive voltage divider is coupled to the negative input of the error amplifier 44. A reference voltage source 47 produces a reference voltage 51 that is coupled to the positive input of the error amplifier 44. The output of the error amplifier 52 is coupled to the positive input of comparator 20 to complete a feedback loop from the load 42 input.

A compensation circuit Zcomp 54 is provided to maintain stability within the closed loop system. More specifically, the Zcomp circuit 54 is a frequency dependent network that operates to compensate the feedback loop including the error amplifier 44 for the frequency response of the LC circuit 64, 68 and other elements within the control loop including the PWM signal path and the feedback path through error amplifier 44.

Operation of the shutter circuit 28 will be more fully understood by reference to the illustrative embodiment depicted in FIG. 3. Referring to FIGS. 3 and 4, the SHUTTEREN signal 31 is provided to enable the shutter circuit 28 as discussed above. When the shutter enable signal SHUTTEREN 31 is asserted, the shutter circuit 28 is operative to receive the PWMRAW signal 26 (which may include double pulses due to noise) and to generate an output signal PMWOUT 30 that removes the double pulses from the pulse width modulated signal PWMRAW 26. More specifically, when the SHUTTEREN signal 31 is high, NAND gate 102 is enabled and the Latch_B output signal 95 is gated through to PWMOUT 30. When the SHUTTEREN signal 31 is de-asserted (low) the output of NAND gate 102 is always high and the shutter circuit 28 is bypassed. The SHUTTEREN signal 31 is coupled to inverter 100 which is high when the SHUTTEREN signal 31 is de-asserted. Thus, when the shutter enable signal SHUTTEREN 31 is low, the NAND gate 104 is enabled to gate the raw PWM signal PWMRAW 26 through to the shutter circuit output PWMOUT 30. The SHUTTEREN signal 31 may be controlled via a switch or under software control so as to be configurable by a user of the equipment in which the presently disclosed PWM controller is employed.

Additionally, an initialization signal INIT 33 is provided to the shutter circuit 28 to initialize first and second latches Latch A 84 and Latch B 94. More specifically, Latch A 84 is a conventional set-reset latch consisting of first and second cross-coupled nor gates 84a, 84b. Similarly, Latch B 94 is a conventional set-reset latch consisting of first and second cross-coupled nor gates 94a, 94b. When the INIT 33 signal is asserted, the Latch_A output signal 85 is driven low. The Latch_A output signal 85 and the Latch_B output signal remain low as long as the INIT 33 signal is asserted.

Following initialization of the shutter circuit 28 as discussed above, Latch A 84 is triggered on the first positive going transition of the PWMRAW signal 26. The triggering of Latch A 84 serves to arm Latch B 94 and permits Latch B 94 to be reset in response to the next crossing of the reference voltage 52 by the analog waveform 24 after a predetermined delay period. In particular, the Latch_A output signal 85 is low following the initialization of Latch A 84 via the INIT signal 33 and the transition of the INIT signal 33 to the low state enabling NAND gate 80. When the PWMRAW signal 26 transitions to the high state, the output of inverter 82 goes high setting the Latch_A output signal 85 high. Further transitions such as double pulsing of the PWMRAW signal 26 on the transition from the low state to the high state cannot affect the Latch_A output signal 85 until the Latch A 84 is reset by the RESETL signal 32. Periodically, the RESETL signal 32 provides a negative going pulse that is employed to reset Latch A 84. In the illustrative embodiment the RESETL signal 32 is asserted at the peak of the ramp signal 24 generated by the ramp generator 22. The period of the RESETL signal corresponds to the period of the analog waveform input to the comparator 2 (See FIG. 2). Thus, as illustrated in FIG. 4, the Latch A output signal 85 transitions high upon the first rising edge of the PWMRAW signal 26 within the period of the RESETL signal 32 and remain high until the assertion of RESETL 32. In the foregoing manner, a high speed comparator may be employed and even if double pulsing appears on the PMWRAW signal 26, any double pulsing associated with the upward transition of the PWMRAW signal 26 is eliminated by Latch A 84.

The Latch_A output signal 85 is coupled to the input of a delay line 86 comprising a plurality of inverters. In the illustrated embodiment three inverters 86a, 86b, and 86c are employed although the number of inverters may be selected to obtain a desired delay. Additionally, any technique known in the art for generating an appropriate delay may be employed. In one embodiment a delay of approximately 20 nanoseconds was found to be suitable.

The Latch_A_DelayedL signal 87, the RESETL 32 signal and the PMWRAW signal 26 are applied to NAND gate 90. The output of NAND gate 90 is a pulse approximately equal to the delay interposed by the delay line 86. More specifically, referring to FIG. 4, on the positive transition of PWMRAW 26, Latch_A_DelayedL 87 remains high for approximately the length of the delay interposed by the delay line 86 and the RESETL 32 signal remains in the high state. Accordingly, NAND gate 90 produces a short negative going pulse that is inverted by inverter 92. The positive going pulse at the output of inverter 92 sets Latch B 94 such that the Latch_B output signal 95 is asserted. The PWMRAW signal 26 is coupled through inverter 96 to an input of NOR gate 94b forming a part of Latch B 94. On the first negative going transition of PWMRAW 26 following the assertion of the Latch_B output signal 95 and following the reset pulse appearing at the output of inverter 92, the inverted PWMRAW signal 27 causes the output of NOR gate 94b to go low and to latch in the low state. Any subsequent pulsing of the PWMRAW signal 26 does not affect the state of the Latch_B output signal 95 during the, respective reset interval until the shutter circuit 28 is reset by the RESETL pulse 32. The Latch_B 95 output signal is passed through NAND gate 102 in inverted form to the input of NAND gate 106 when NAND gate 102 is enabled by SHUTTEREN 31. The output of NAND gate 106 constitutes the PWMOUT signal 30. The PWMOUT signal 30 thus provides noise immunity and eliminates double pulsing while allowing a high speed comparator to be used for the generation of the PWMRAW signal 26. Thus, the presently disclosed system provides the benefits of a high speed comparator 2 to obtain a rapid transient response and is operative when enabled to eliminate undesirable double pulsing at the input of the switching transistor 60.

The periodic reset intervals are established by the RESETL 32 signal. In normal operation when INIT 33 is asserted, the RESETL 32 signal causes the PWMOUT 30 signal to go into a de-asserted state. In this state the controller is not delivering power to the load 42. Upon the first instance at which the voltage of analog waveform on the input 24 of the comparator 20 crosses the reference voltage appearing on the reference signal 52, the PWMRAW signal 26 causes latch 84 to be set. The setting of Latch A 84 generates a transition at the Latch_A output 85 that is passed through the delay line 86 to produce the Latch_A_DelayedL signal 87. The PWMRAW signal 26 and the Latch A_DelayedL 87 are combined to generate the pulse that sets Latch B 94. The setting of the latch 94 corresponds to the condition in which power is applied to the load 42.

Once Latch_B 84 is set, it remains set until the analog input waveform on input 24 to the comparator 20 again crosses the voltage on the reference input 52 of the comparator 20. When the analog input waveform crosses the reference voltage input, the output of Latch B 95 is reset, and the PWMOUT 30 signal returns to the state in which power is not delivered to the load 42.

The timing within a period corresponding to the interval between reset pulses is illustrated in FIG. 4. As depicted in FIG. 4, in one reset interval defined between reset pulses 32a and 32b a noise pulse 110 is illustrated on the reference voltage input signal 52. The reset pulse RESETL 32 initializes the shutter circuit 28 at the beginning of each reset interval by resetting Latch A 24. A negative going transition of the ramp signal 24 voltage through the reference voltage 52 results in a positive transition of the PMWRAW signal 26 which results in the setting of Latch B 94. In the period between the reset pulse 32 and the first negative going crossing of the voltage reference by the ramp signal 24, the Latch_B output 95 signal is de-asserted. Since the Latch_B output signal corresponds to the PWMOUT signal 30, the de-assertion of the Latch_B output signal 95 corresponds to the state in which power is not being delivered to the load. When the output signal 24 from the Vramp generator 22 first crosses the reference voltage 52 within the reset interval between pulses 32a and 32b, the PWMOUT signal 30 is set to the asserted (power delivery) state. Thereafter, when the output signal 24 from the Vramp generator 22 next crosses the reference voltage 52 within the reset interval (at noise pulse 110) the Latch B output signal 95 is latched in the de-asserted (no power delivery) state and the PWMOUT signal 30 remains in the de-asserted state for the duration of the respective interval between reset pulses 32. Thus, double pulsing within each reset interval in prevented. In the case in which a noise pulse occurs near the end of a reset cycle as illustrated by pulse 110, it will be apparent that the noise will not significantly affect the duty cycle of the PWMOUT signal 30 within the respective interval between reset pulses 32.

In the situation in which a noise pulse 112 occurs early within a reset interval, the shutter circuit 28 shortens the time in which the PWMOUT signal 30 is asserted (power delivery state). More specifically, in the interval between reset pulses 32b and 32c, the noise pulse 112 is depicted as appearing on the reference voltage input signal 52 to the comparator 20 early in the reset interval. Upon the initial crossing of the reference voltage input 52 by the analog input waveform voltage 24, the comparator 20 generates a PWMRAW signal 26 transition that causes the PWMOUT signal 30 to assume the power asserted state. Upon the next crossing of the reference voltage input 52 by the analog input waveform voltage 24, which in the instant example is caused prematurely by the presence of the noise pulse 112, the Latch_B output signal 95 is latched in the de-asserted state that corresponds to the state in which power is not delivered to the load 42. As depicted in FIG. 4, is this circumstance, the PWMOUT pulse 30 is foreshortened in the respective reset interval between pulses 32b and 32c. Though double pulses exist on the PWMRAW signal 26, such pulses are removed by the shutter circuit 28 and are not present in the PWMOUT signal 30 that is coupled to the driver 34.

The elimination of double pulsing as described above, minimizes undesirable transitions of the switching transistor 60 that can lead to excessive heating and possible failure of the switching transistor 60. The above-described shutter circuit 28 further operates to drive the PWMOUT signal 30 to the de-asserted or non-power delivery state in the event of noise on either the reference voltage 52 or the analog input voltage 24. This operation is desirable in that it prevents a potentially destructive condition in which power could be applied to the load for a far greater duty cycle than is intended. In this respect, the shutter circuit 28 safely limits the output power from the PWM controller in the event of noise on the input signals 24, 52 to the comparator 20.

The illustrated embodiment depicts a PWM controller that employs a single comparator for the generation of the PWMRAW signal 26. It should be appreciated that multiple comparators may be employed in the generation of PWM-RAW signal 26, e.g. one comparator for the comparison as the analog waveform 24 is increasing in voltage with respect to a first reference voltage and a second comparator for the comparison as the analog waveform 24 is decreasing in voltage with respect to a second reference voltage. The first and second reference voltages may be the same or different reference voltages. The outputs of the respective comparators may be combined to form the PWMRAW signal 26 or alternatively, fed to the shutter circuit 28. The shutter circuit 28 may utilize the outputs of the respective comparators to prevent double pulsing on the shutter circuit output signal 30 via a latching technique as described above.

It should be appreciated that the above described shutter circuit 28 is illustrative of logic employing first and second latches 84, 94 in a system in which both edge transitions of the PWMOUT signal 30 are based upon comparisons of an analog input voltage waveform to a reference voltage using a high speed comparator. It will be understood by those of ordinary skill in the art that variations in polarities of signals, and other modifications to and variations of the above-described PWM controller and shutter circuit may be made without departing from the inventive concepts disclosed herein. Accordingly, the invention should not be viewed as limited except by the scope and spirit of the appended claims.

What is claimed is:

1. A pulse width modulation controller for powering a load comprising:

at least one comparator having first and second inputs for receiving a generally repeating analog waveform having a predetermined periodic interval and a reference voltage at respective inputs, said at least one comparator operative to produce at least one output signal corresponding to a pulse width modulated output signal having a first comparator output state corresponding to a power off state in which power is not delivered to the load and a second comparator output state corresponding to a power on state in which power is delivered to the load; and a shutter circuit coupled to said at least one comparator output, said shutter circuit having a shutter circuit output, said shutter circuit receiving a periodic reset pulse at an interval that corresponds to said predetermined periodic interval, said reset signal having an asserted state and a de-asserted state, said shutter circuit output having a first logic state corresponding to said state when power is not delivered to said load and a second logic state corresponding to said state when power is delivered to said load, said shutter circuit operative:

to switch said shutter circuit output from said first logic state to said second logic state and to arm said shutter circuit to permit a transition of said shutter circuit output from said second logic state to said first logic state in response to the first crossing of said reference voltage in a first direction by said analog waveform subsequent to a respective reset pulse;

to cause said output of said shutter circuit output to assume said first logic state in response to the next crossing of said reference voltage by said analog waveform in a second direction opposite to said first direction subsequent to said arming of said shutter circuit; and to maintain said shutter circuit output in said first logic state for the duration of said interval.

2. The pulse width modulation controller of claim 1 wherein said shutter circuit includes a first latch having first and second inputs an output and first and second output states that correspond to said shutter circuit output states, said shutter circuit operative within said interval to:

trigger said first input of said first latch to cause said output of said first latch to assume said second logic state in response to the first crossing of said reference voltage in a first direction by said analog waveform subsequent to said respective reset pulse;

trigger said second input of said first latch to cause said output of said first latch to assume said first logic state in response to the next crossing of said reference voltage by said analog waveform in a second direction opposite to said first direction; and maintain said output of said first latch in said first logic state for the duration of said interval.

3. The pulse width modulation controller of claim 2 wherein said shutter circuit further includes:

a second latch having first and second inputs and an output, said first input being responsive to said reset pulse to set said output of said second latch to a first logic state, said second input being responsive to a transition in said at least one comparator output to cause said output of said second latch to transition to a second logic state; and a delay line having an input and an output, said delay line input coupled to said output of said second latch, said first input of said first latch being responsive to said delay line output and said at least one comparator output to cause said output of said first latch to assume said second logic state.

4. The pulse width modulation controller of claim 3 wherein said first and second latches comprise pairs of cross coupled NOR gates.

5. The pulse width modulation controller of claim 3 wherein said delay line comprises a plurality of inverters.

6. The pulse width modulation controller of claim 1 further including;

a driver having an input and an output, said driver input being coupled to said output of said shutter circuit;

a smoothing circuit; and a switching transistor having an input terminal and an output terminal, said driver output being coupled to said switching transistor input terminal, wherein the output terminal of said switching transistor is coupled to said load through said smoothing circuit.

7. The pulse width modulation controller of claim 1 wherein said controller further includes bypass logic responsive to an enable input to select said shutter circuit output as the operative output when said enable input is in a first logic state and to select said at least one comparator output as the operative output of said shutter circuit when said enable input is in a second logic state.

8. A method of eliminating double pulsing in the output of a pulse width modulation (PWM) controller having at least one comparator receiving a first periodic analog waveform on a first input and at least one reference voltage on a second input of said at least one comparator, wherein said at least one comparator is operative to produce a raw PWM output signal, said method comprising the steps of:

initializing a shutter circuit coupled to the output of said at least one comparator in response to a reset pulse ocurring at a periodic interval so as to permit a shutter circuit output having first and second logic states to transition from said first logic state corresponding to a state in which power is not delivered to said load to a second logic state in which power is delivered to said load in response to the first crossing of said reference voltage by said analog waveform in a first direction subsequent to a respective reset pulse;

generating a shutter circuit output having said second logic state in response to said first crossing of said reference voltage in said first direction by said analog waveform subsequent to the respective reset pulse and arming said shutter circuit to permit said shutter circuit output to transition from said second logic state to said first logic state in response to said first crossing of said reference voltage by said analog waveform in said first direction;

triggering said shutter circuit to cause said shutter circuit output to assume said first logic state in response to the next crossing of said reference voltage by said analog waveform in a second direction opposite to said first direction subsequent to said arming of said shutter circuit within the respective periodic interval; and maintaining said shutter circuit output in said first logic state until at least the occurence of the next reset pulse.

9. The method of claim 7 further including the step of:

coupling a signal corresponding to said shutter circuit output to an input of a switching transistor driver in the event an enable signal is in an first logic state; and decoupling said signal corresponding to said shutter circuit output from said input to said switching transistor driver and coupling said raw PWM output signal to said input of said switching transistor driver in the event said enable signal is in a second logic state.

* * * * *